United States Patent
Oomori et al.

(10) Patent No.: US 9,929,021 B2
(45) Date of Patent: Mar. 27, 2018

(54) DRY ETCHING METHOD AND DRY ETCHING AGENT

(71) Applicant: Central Glass Company, Limited, Ube-shi, Yamaguchi (JP)

(72) Inventors: Hiroyuki Oomori, Ube (JP); Akifumi Yao, Ube (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 15/264,208

(22) Filed: Sep. 13, 2016

(65) Prior Publication Data

US 2017/0084467 A1   Mar. 23, 2017

(30) Foreign Application Priority Data

Sep. 18, 2015  (JP) .................................. 2015-184728

(51) Int. Cl.
*H01L 21/311* (2006.01)
*H01L 21/02* (2006.01)

(52) U.S. Cl.
CPC .. *H01L 21/31122* (2013.01); *H01L 21/02118* (2013.01); *H01L 21/02211* (2013.01); *H01L 21/02252* (2013.01); *H01L 21/31144* (2013.01)

(58) Field of Classification Search
CPC ......... H01L 21/31122; H01L 21/02211; H01L 21/02252; H01L 21/31144; H01L 21/02118
See application file for complete search history.

(56) References Cited

U.S. PATENT DOCUMENTS

| | | |
|---|---|---|
| 2010/0311251 A1 | 12/2010 | Okada et al. |
| 2011/0049098 A1 | 3/2011 | Koiwa |
| 2011/0281438 A1 | 11/2011 | Lee et al. |
| 2012/0003838 A1 | 1/2012 | Ookuma et al. |
| 2014/0302683 A1 | 10/2014 | Kikuchi et al. |
| 2014/0306146 A1 | 10/2014 | Ito et al. |
| 2014/0349488 A1 | 11/2014 | Takada et al. |
| 2015/0004795 A1 | 1/2015 | Ishii |

FOREIGN PATENT DOCUMENTS

| | | |
|---|---|---|
| JP | 10-242127 A | 9/1998 |
| JP | 2011-49360 A | 3/2011 |
| JP | 2012-15343 A | 1/2012 |
| JP | 2015-12178 A | 1/2015 |
| KR | 10-2010-0105638 A | 9/2010 |
| TW | 201107519 A1 | 3/2011 |
| TW | 201140685 A1 | 11/2011 |
| TW | 201250836 A1 | 12/2012 |
| TW | 201313878 A1 | 4/2013 |

OTHER PUBLICATIONS

Taiwanese-language Office Action issued in counterpart Taiwanese Application No. 10620936030 dated Sep. 13, 2017 (Four (4) pages).
Korean-language Office Action issued in counterpart Korean Application No. 10-2016-0118350 dated Nov. 16, 2017 (7 pages).

*Primary Examiner* — Nadine Norton
*Assistant Examiner* — Mahmoud Dahimene
(74) *Attorney, Agent, or Firm* — Crowell & Moring LLP

(57) ABSTRACT

A dry etching method provided to involve the steps of: (a) disposing a substrate within a chamber, the substrate having an amorphous carbon film; (b) preparing a plasma gas by converting a dry etching agent into a plasma, the dry etching agent containing at least oxygen and alkylsilane; and (c) conducting plasma etching on the amorphous carbon film by using the plasma gas and an inorganic film as a mask.

8 Claims, 4 Drawing Sheets

EXAMPLE

COMPARATIVE EXAMPLE

DRY ETCHING METHOD AND DRY ETCHING AGENT

BACKGROUND OF THE INVENTION

This invention relates to improvements in dry etching method for amorphous carbon used as an organic hard mask.

In today's semiconductor device fabrication, the trend toward micro-patterning for circuits has been developed, with which a photoresist layer used as an etching mask for forming a pattern by exposure has been getting thinned. However, the thus thinned photoresist layer was sometimes insufficient in etching resistance to form a pattern onto an object to be etched. This problem gets particularly outstanding in the case of forming a pattern having a high aspect ratio (a ratio between the dimension and the depth of the pattern). Accordingly, a multilayer resist process where a pattern of a photoresist layer is firstly transferred to another thick lower portion and then the pattern is formed onto an object to be etched by using the thick lower portion as a mask has been adopted in recent years.

An example of the multilayer resist process will be explained with reference to FIG. 2. FIG. 2 illustrates a case intending to provide a hole or line pattern with high aspect ratio on a silicon-based foundation layer 3, for example. First of all, a foundation layer 3 (an object to be etched) is formed on a substrate 2 and then an amorphous carbon layer (a-C layer) 4, an inorganic intermediate layer 5 and a photoresist layer 6 are sequentially laminated as shown in FIG. 2A. Then, the photoresist layer 6 is exposed to light by using a photomask (though not shown) and then developed thereby being provided with a certain hole pattern as shown in FIG. 2B. Thereafter, the inorganic intermediate layer 5 is subjected to etching by using the photoresist layer 6 as a mask to transfer the hole pattern of the photoresist layer 6 to the inorganic intermediate layer 5 as shown in FIG. 2C. Then, the a-C layer 4 is etched by using the inorganic intermediate layer 5 as a mask so that the hole pattern of the inorganic intermediate layer 5 (namely, the hole pattern of the photoresist layer 6) is transferred to the a-C layer 4 as shown in FIG. 2D. Subsequently, the foundation layer 3 is etched by using the a-C layer 4 as a mask so that the certain pattern is formed onto the foundation layer 3 as shown in FIG. 2E. Finally, the masks such as the a-C layer 4 are removed thereby obtaining a foundation layer 3 having a certain pattern, as shown in FIG. 2F. Hence the a-C layer 4, the inorganic intermediate layer 5 and the photoresist layer 6 are sometimes referred to together as a multilayer resist film.

In a method disclosed by Patent Document 1, a multilayer resist mask is provided including an upper resist film (corresponding to the photoresist layer 6 as shown in FIG. 2), an inorganic intermediate film (corresponding to the inorganic intermediate layer 5 as shown in FIG. 2) and a lower resist film (corresponding to the a-C layer 4 as shown in FIG. 2), and these films are processed by different steps or by different etching gases. More specifically, the upper resist film is exposed and patterned through the lithography technique. The inorganic intermediate film is etched by plasma in use of a dry etching agent comprising a mixed gas containing $SF_6$ and $CHF_3$ with the upper resist film 201 as a mask. Then, the lower resist film (serving as an organic film) is etched by plasma in use of a mixed gas containing $O_2$, HBr, and $N_2$ with the inorganic intermediate film as a mask.

With regard to a photoresist constituting the photoresist layer 6 and a silicon-based material constituting the inorganic intermediate layer 5 (which is SiON in most cases), already-existing exposure apparatuses and dry etching apparatuses may be diverted thereto as they are.

However, it is difficult to say that a method authentic as an etching method for amorphous carbon constituting the a-C layer 4 has been established.

This is because isotropic etching tends to occur or because side etch as shown in FIG. 3 tends to occur, in a case of etching amorphous carbon upon converting $O_2$ (which is the principal etching agent) into plasma. As a result, the cross-sectional shape tends to be a round one, the so-called bowing shape. In FIG. 3 where the a-C layer 4 is formed on the foundation layer 3 and additionally the inorganic intermediate layer 5 (serving as an inorganic hard mask) having a certain opening is formed thereon, the a-C layer 4 is scraped more than intended to generate a side etch 7 since isotropic etching is caused at the time of etching the a-C layer 4.

In order to prevent these problems, there are employed for etching the amorphous carbon layer: a mixed gas of $O_2$ and COS, obtained by adding COS (carbonyl sulfide) to $O_2$ (see Patent Document 2); or a mixed gas of $O_2$, COS and $Cl_2$ (see Patent Document 3).

REFERENCES ABOUT PRIOR ART

Patent Document 1: Japanese Patent Application Publication No. 2012-015343
Patent Document 2: Japanese Patent Application Publication No. 2011-049360
Patent Document 3: Japanese Patent Application Publication No. 2015-012178
Patent Document 4: Japanese Patent Application Publication No. H10-242127

SUMMARY OF THE INVENTION

However, drawbacks have been encountered in the above discussed conventional etching methods. As mentioned above, the methods of Patent Documents 2 and 3 have employed a mixed gas obtained by adding COS to $O_2$ and the like, for etching the amorphous carbon layer 4 constituting a lower layer portion of the multilayer resist film. Incidentally, COS is a gas originally used as an etching gas in a process of etching an organic antireflection film as discussed in Patent Document 4, which is selectively deposited on a side wall of a resist mask at the time of etching or on a side wall of an organic film becoming patterned thereby allowing the formation of a firm sidewall protection film.

The addition of COS to $O_2$ brings about a good effect if the object to be etched is as relatively thin as an antireflection film of about 100 nm thickness; however, when a thickness enough to withstand the subsequent etching step (for example, a thickness of about 200 nm to 1 μm) is provided as in the case of a lower resist layer, the progress of side etch becomes more outstanding so that an enough sidewall protection effect cannot be obtained even with the addition of COS. A dimensional displacement of the amorphous carbon layer serving as a mask directly results in another dimensional displacement in the subsequent etching steps, so that there has been desired an etching method which can suppress the occurrence of abnormal etching shapes such as bowing and the like at the time of etching the amorphous carbon layer.

Furthermore, in the case where COS is added, the surface of the sidewall protection film formed in the etching step have often got rough. If the surface of the side wall of an opening formed in the amorphous carbon layer is not smooth, it seems to be difficult to attain a desired etching shape in an etching step using the amorphous carbon layer as a mask.

Patent Document 3 discloses that $Cl_2$ is added together with COS for the purpose of not only suppressing the occurrence of bowing but also giving inclination to or tapering the formed side wall. The effect of suppressing bowing is certainly confirmed, but chlorine is highly corrosive to aluminum (serving as a material for constituting a chamber) so that an additive applicable as a substitute therefor has been desired.

In view of the above, an object of the present invention is to provide an improved etching method which can effectively overcome drawbacks encountered in conventional etching methods. More specifically, an object of the present invention is to provide a dry etching method which can prevent the occurrence of abnormal etching shapes such as the bowing and the roughness of sidewall surface at the time of etching an amorphous carbon film in order to form a hole pattern, the etching of the amorphous carbon film being performed in such a manner as to dispose a substrate having the amorphous carbon film within a chamber and then to use an inorganic film as a mask.

As a result of the present inventors having eagerly made studies in view of the above problems, it is found possible to form a sidewall protection film having a firm and smooth surface to suppress side etching if a mixed gas obtained by adding alkylsilane to $O_2$ is used for etching amorphous carbon.

An aspect of the present invention resides in a dry etching method comprising the steps of: (a) disposing a substrate within a chamber, the substrate having an amorphous carbon film; (b) preparing a plasma gas by converting a dry etching agent into a plasma, the dry etching agent containing at least oxygen and alkylsilane; and (c) conducting plasma etching on the amorphous carbon film by using the plasma gas and an inorganic film as a mask.

Another aspect of the present invention resides in a dry etching agent used in the above-mentioned dry etching method, comprising: at least one kind of alkylsilane selected from the group consisting of $(CH_3)_4Si$, $(CH_3)_3SiH$, $(CH_3)_2SiH_2$ and $(CH_3)SiH_3$; and oxygen.

A further aspect of the present invention resides in a sidewall protection resist film-forming additive for forming a sidewall protection film on amorphous carbon, the additive being added to a dry etching agent containing oxygen for etching amorphous carbon, the additive comprising at least alkylsilane.

The other objects and features of this invention will become understood from the following description with reference to the accompanying drawings.

According to the present invention, it is possible to provide an etching method which can: form a sidewall protection film on the side wall of a patterned amorphous carbon layer to suppress side etching; prevent a dimensional displacement; and suppress the occurrence of abnormal etching shapes at the time of etching the amorphous carbon layer.

DETAILED DESCRIPTION OF THE INVENTION

Figure 1A:
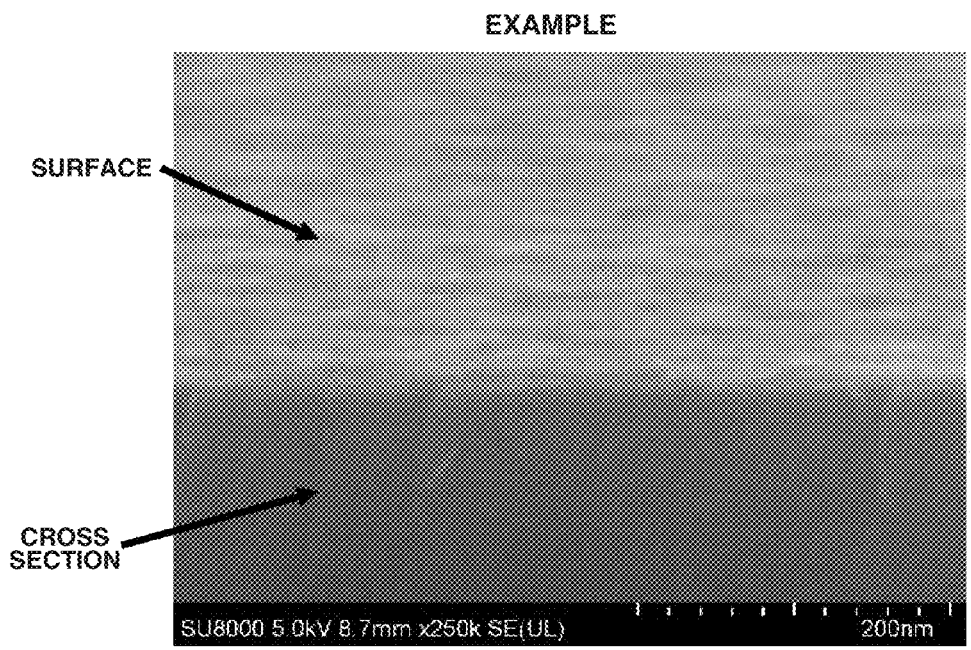
FIG. 1A is an SEM (scanning electron microscope) image of a cross-sectional structure of a vertically disposed silicon wafer C of Example 2 after etching.

Hereinafter, an embodiment of the present invention will specifically be discussed; however, the present invention is not limited to the following embodiment, and modifications and variations of the embodiment will occur to those skilled in the art in light of the teachings of the invention.

In a dry etching method according to the present invention, etching of an amorphous carbon layer is performed with the use of an inorganic film as a mask, through a plasma etching using a dry etching agent containing at least oxygen and alkylsilane.

As an inorganic film used as a mask, it is possible to employ: a film of a silicon-based material such as Si (silicon), SiON (silicon oxynitride), SiN (silicon nitride), $SiO_x$ (silicon oxide), SiC (silicon carbide) and SiOC (silicon oxycarbide); and a metal film. Though a film-formation method for the amorphous carbon layer is not particularly limited, it is possible to adopt coating method and CVD method. In the case of coating method, a solution prepared by dissolving a polymeric material principally constructed of benzene ring structure in a solvent such as N-methylpyrrolidone, dimethylformamide and halogenated hydrocarbon is applied to an article and dried, thereby forming a film. On the other hand, the treatment gas used in the case of CVD method may be a hydrocarbon gas including propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$) etc. or a gas containing these compounds as the principal component. Moreover, the treatment gas may contain oxygen.

As alkylsilane, it is possible to cite a compound selected from the group consisting of $(CH_3)_4Si$, $(CH_3)_3SiH$, $(CH_3)_2SiH_2$ and $(CH_3)SiH_3$, and a mixture thereof. Taking the distribution situation and the availability into account, $(CH_3)_4Si$ or $(CH_3)_3SiH$ is particularly preferable.

When alkylsilane is mixed with $O_2$ and converted into a plasma, its Si moiety is deposited onto the side wall of a through hole as a polymer film of Si or $SiO_x$ (an oxide thereof) thereby forming a protection film, while its methyl group reacts to $O_2$ so as to be removed in the form of $H_2O$ or $CO_2$. Thus, isotropic etching of amorphous carbon which tends to develop in the presence of $O_2$ only can be prevented and selective etching becomes feasible.

If the concentration of alkylsilane is excessively high, the strong protection film is formed also on a surface layer of amorphous carbon to inhibit the progress of etching. Accordingly, the concentration of alkylsilane is preferably not larger than 15% by volume, more preferably not larger than 5% by volume, much more preferably not larger than 4% by volume relative to the flow rate of $O_2$. On the contrary, an excessively low concentration of alkylsilane makes the amorphous carbon protection effect difficult to be obtained, and therefore the alkylsilane concentration is preferably not smaller than 0.1% by volume relative to the flow rate of $O_2$.

In order to ensure an etching rate sufficient for amorphous carbon, the $O_2$ concentration is preferably not smaller than 10% by volume, further preferably not smaller than 50% by volume, more preferably not smaller than 80% by volume, and much more preferably not smaller than 90% by volume relative to the total flow rate. Additionally, the dry etching agent may consist only of oxygen and alkylsilane.

Moreover, the dry etching agent may contain an inert gas for the purpose of increasing the handling security while reducing the cost. Examples of the inert gas include nitrogen gas and rare gases such as argon gas, helium gas, neon gas, krypton gas and xenon gas. Additionally, the dry etching agent may consist only of oxygen, alkylsilane and an inert gas.

Furthermore, it is also possible to add a conventionally known gas to the dry etching agent in order to adjust the etching rate and the etching selectivity ratio. Such an additive gas may be exemplified by $O_3$, CO, $CO_2$, $H_2$, $NH_3$, NO, carbonyl sulfide etc. Additionally, the dry etching agent may consist only of oxygen, alkylsilane and the above-mentioned additive gas or only of oxygen, alkylsilane, an inert gas and the above-mentioned additive gas.

At the time of etching, it is preferable that a bias voltage is applied. A bias voltage to be generated is preferably not lower than 500 V, more preferably not lower than 1000 V in order to attain an etching highly isotropic in the vertical direction of the layers. A higher bias voltage reduces side etch more and more. However, bias voltages exceeding 10000 V considerably damage the substrate and therefore not preferable.

Concerning each of $O_2$, alkylsilane and an inert gas, which are contained in the etching gas, it is possible to adopt a highly pure product for etching use with a purity of 99.9% or greater.

The gas components contained in the etching gas may mutually independently be introduced into a chamber or may be introduced into a chamber upon previously being prepared into a mixture gas. The total flow rate of the dry etching agent to be introduced into a reaction chamber may suitably be selected according to the volume of the reaction chamber and the gas-discharging ability of a discharge port, in consideration of the above-mentioned concentration condition and pressure condition.

The pressure applied in etching is preferably not more than 10 Pa for stably obtaining a plasma and for enhancing the straight-travelling ability of ion to prevent side etch, and particularly preferably not more than 5 Pa. Meanwhile, if the pressure within the chamber is too low, the number of ions generated by electrolytic dissociation is reduced so as not to obtain a sufficient plasma density; therefore the pressure is preferably not less than 0.05 Pa.

In addition, the substrate temperature at the time of etching is preferably not larger than 50° C. Particularly in the case of performing anisotropic etching, the substrate temperature is more preferably not larger than 20° C. High temperatures exceeding 50° C. reduce the amount of producing the sidewall protection film and strengthen a tendency to accelerate the isotropic etching, so that a desired machining accuracy cannot be attained.

In view of the efficiency in device fabrication process, it is preferable that the etching time is 30 minutes or shorter. By the way, the etching time means a time during which a plasma is generated inside the chamber and the sample is reacted to the dry etching agent.

The etching method using a dry etching agent according to the present invention is not limited to various etching methods such as capacitive coupled plasma (CCP) etching, reactive ion etching (RIE), inductive coupled plasma (ICP) etching, electron cyclotron resonance (ECR) plasma etching, microwave etching and the like.

EXAMPLES

Referring now to Examples and Comparative Examples, the present invention will specifically be discussed. However, the invention is not limited to these examples.

Example 1

Etching Step

Figure 4:
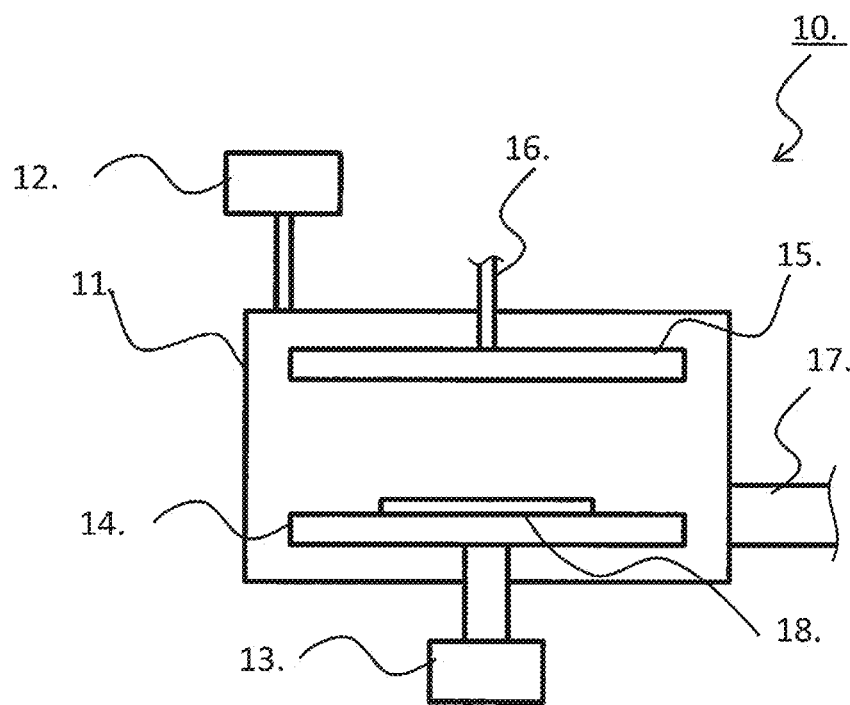
FIG. 4 is a schematic view of a reaction apparatus used in Examples and Comparative Examples.

FIG. 4 is a schematic view of a reaction apparatus 10 used in Examples and Comparative Examples. Inside a chamber 11, a lower electrode 14 also serving as a stage and having the function of holding a wafer, and an upper electrode 15, and a pressure gage 12 are disposed. The chamber 11 is connected at its top portion to a gas inlet 16. The chamber 11 is adapted to be adjustable in terms of internal pressure and to be able to excite the dry etching agent by a high-frequency power source 13 (13.56 MHz). With this arrangement, it is possible to bring the exited dry etching agent into contact with a sample 18 disposed onto the lower electrode 14 to achieve etching of the sample 18. The reaction apparatus 10 is arranged to generate a direct current (called a bias voltage) between the upper electrode 15 and the lower electrode 14 when a high-frequency power is applied from the high-frequency power source 13 under a state of the dry etching agent incoming, the bias voltage being generated by the difference of travelling velocity between ions and electrons in the plasma. Gas residing inside the chamber 11 is discharged through a gas discharge line 17.

As the sample 18, a silicon wafer A provided to have an amorphous carbon layer and a silicon wafer B provided to have a SiON layer were horizontally disposed on the stage. Additionally, for the purpose of measuring the amount of side etch, a silicon wafer C provided to have an amorphous carbon layer was vertically disposed on the stage. The amorphous carbon layers and the SiON layer were produced by CVD method.

Then, $O_2$ and $(CH_3)_3SiH$ are mixed at a ratio of 99.9% and 0.1% by volume relative to the total flow rate, respectively, to prepare 100 sccm of an etching agent in total. This etching agent was circulated and subjected to an application of 400 W high-frequency power to be converted into a plasma, thereby accomplishing etching. Incidentally, the bias voltage was 500 V.

Concerning each of the amorphous carbon layer of the silicon wafer A, the SiON layer of the silicon wafer B and the amorphous carbon layer of the silicon wafer C, the variation in thickness between before and after etching was measured, from which the etching rate was calculated.

Example 2

The procedures of Example 1 were repeated with the exception that the etching agent was prepared by mixing $O_2$ and $(CH_3)_3SiH$ at a ratio of 98% and 2% by volume relative to the total flow rate, respectively, thereby accomplishing etching.

Example 3

The procedures of Example 1 were repeated with the exception that the etching agent was prepared by mixing $O_2$ and $(CH_3)_3SiH$ at a ratio of 96% and 4% by volume relative to the total flow rate, respectively, thereby accomplishing etching.

Example 4

The procedures of Example 1 were repeated with the exception that the etching agent was prepared by mixing $O_2$ and $(CH_3)_3SiH$ at a ratio of 95% and 5% by volume relative to the total flow rate, respectively, thereby accomplishing etching.

Example 5

The procedures of Example 1 were repeated with the exception that the etching agent was prepared by mixing $O_2$ and $(CH_3)_3SiH$ at a ratio of 90% and 10% by volume relative to the total flow rate, respectively, thereby accomplishing etching.

Example 6

The procedures of Example 1 were repeated with the exception that the etching agent was prepared by mixing Ar, $O_2$ and $(CH_3)_3SiH$ at a ratio of 89%, 10% and 1% by volume relative to the total flow rate, respectively, thereby accomplishing etching.

Example 7

The procedures of Example 1 were repeated with the exception that the etching agent was prepared by mixing $O_2$ and $(CH_3)_4Si$ at a ratio of 98% and 2% by volume relative to the total flow rate, respectively, thereby accomplishing etching.

Comparative Example 1

The procedures of Example 1 were repeated with the exception that $O_2$ only was used as the etching agent and any other additive gas was not added thereto, thereby accomplishing etching.

Comparative Example 2

The procedures of Example 1 were repeated with the exception that the etching agent was prepared by mixing $O_2$ and COS at a ratio of 90% and 10% by volume relative to the total flow rate, respectively, thereby accomplishing etching.

Comparative Example 3

The procedures of Example 1 were repeated with the exception that the etching agent was prepared by mixing $O_2$ and COS at a ratio of 80% and 20% by volume relative to the total flow rate, respectively, thereby accomplishing etching.

Comparative Example 4

The procedures of Example 1 were repeated with the exception that the etching agent was prepared by mixing $O_2$ and COS at a ratio of 98% and 2% by volume relative to the total flow rate, respectively, thereby accomplishing etching.

Comparative Example 5

The procedures of Example 1 were repeated with the exception that the etching agent was prepared by mixing $O_2$ and trifluoromethanesulfonylfluoride ($CF_3SO_2F$) at a ratio of 90% and 10% by volume relative to the total flow rate, respectively, thereby accomplishing etching.

The result of each of Examples and Comparative Examples is shown in Table 1 where "a-C etching rate (vertical direction)" refers to the etching rate for the amorphous carbon layer of the horizontally disposed silicon wafer A, "SiON etching rate" refers to the etching rate for the SiON layer of the silicon wafer B and "a-C etching rate (side)" refers to the etching rate for the amorphous carbon layer of the vertically disposed silicon wafer C. "Etching selectivity ratio (a-C/SiON)" refers to the ratio of the etching rate for the amorphous carbon layer of the silicon wafer A to the etching rate for the SiON layer of the silicon wafer B, while "a-C etching rate ratio (vertical direction/side)" refers to the ratio of the etching rate for the amorphous carbon layer of the silicon wafer A to the etching rate for the amorphous carbon layer of the silicon wafer C.

TABLE 1

| | Oxygen | Additive gas | | Inert gas | | | | | a-C Etching | SiON | a-C Etching | Etching | a-C Etching |
| --- | --- | --- | --- | --- | --- | --- | --- | --- | --- | --- | --- | --- | --- |
| | Concentration [volume %] | Molecular formula | Concentration [volume %] | Molecular formula | Concentration [volume %] | Pressure [Pa] | Applied power [W/cm$^2$] | Bias voltage [V] | rate (vertical direction) [nm/min] | Etching rate [nm/min] | rate (side) [nm/min] | selectivity ratio (a-C/SiON) | rate ratio (vertical direction/side) |
| Example 1 | 99.9 | $(CH_3)_3SiH$ | 0.1 | Ar | 0 | 1 | 1.0 | 500 | 59.1 | 0.0 | 19.1 | — | 3.1 |
| Example 2 | 98 | $(CH_3)_3SiH$ | 2 | Ar | 0 | 1 | 1.0 | 500 | 40.2 | 0.0 | 11.0 | — | 3.7 |
| Example 3 | 96 | $(CH_3)_3SiH$ | 4 | Ar | 0 | 1 | 1.0 | 500 | 20.3 | 0.0 | 6.9 | — | 3.0 |
| Example 4 | 95 | $(CH_3)_3SiH$ | 5 | Ar | 0 | 1 | 1.0 | 500 | 14.1 | 0.0 | 6.1 | — | 2.3 |
| Example 5 | 90 | $(CH_3)_3SiH$ | 10 | Ar | 0 | 1 | 1.0 | 500 | 1.2 | 0.0 | depo | — | — |
| Example 6 | 10 | $(CH_3)_3SiH$ | 1 | Ar | 89 | 1 | 1.0 | 500 | 10.3 | 0.0 | 0.5 | — | 20.6 |
| Example 7 | 98 | $(CH_3)_4Si$ | 2 | Ar | 0 | 1 | 1.0 | 500 | 51.3 | 0.0 | 9.5 | — | 5.4 |
| Comparative Example 1 | 100 | Not added | | Ar | 0 | 1 | 1.0 | 500 | 60.0 | 0.0 | 29.0 | — | 2.1 |
| Comparative Example 2 | 90 | COS | 10 | Ar | 0 | 1 | 1.0 | 500 | 56.5 | 0.0 | 24.6 | — | 2.3 |
| Comparative Example 3 | 80 | COS | 20 | Ar | 0 | 1 | 1.0 | 500 | 49.0 | 0.0 | 17.5 | — | 2.8 |
| Comparative Example 4 | 98 | COS | 2 | Ar | 0 | 1 | 1.0 | 500 | 60.2 | 0.0 | 28.9 | — | 2.1 |

TABLE 1-continued

| | Oxygen | Additive gas | | Inert gas | | | | | a-C Etching | SiON | a-C Etch- | Etch-ing | a-C Etching |
|---|---|---|---|---|---|---|---|---|---|---|---|---|---|
| | Concentration [volume %] | Molecular formula | Concentration [volume %] | Molecular formula | Concentration [volume %] | Pressure [Pa] | Applied power [W/cm²] | Bias voltage [V] | rate (vertical direction) [nm/min] | Etching rate [nm/min] | ing rate (side) [nm/min] | selectivity ratio (a-C/SiON) | rate ratio (vertical direction/side) |
| Comparative Example 5 | 90 | CF₃SO₂F | 10 | Ar | 0 | 1 | 1.0 | 500 | 44.5 | 15.0 | 31.8 | 2.97 | 1.4 |

Note:
An indication "depo" means that a deposit was confirmed generated on the surface and an indication "—" means that the value was substantially infinite.

It can be found from the results of Examples 1 to 7 that, when amorphous carbon was etched by an alkylsilane-containing $O_2$ gas, the amount of side etching was suppressed as compared with Comparative Example 1 where alkylsilane was not contained. Particularly in Examples 1 to 3 there was obtained an a-C etching rate ratio of three or more. Furthermore, as a result of conducting elementary analysis on the surface by EDS, it was found that a silicon-based compound formed a protection film on the surface of amorphous carbon in the case of etching using an alkylsilane-containing $O_2$ gas.

On the other hand, Comparative Example 1 carried out etching with $O_2$ only. Since an element species able to form a protection film does not exist in the reaction system, side etching is greatly developed. Furthermore, in of Comparative Examples 2 to 4, their a-C etching rate ratios remained under three, though COS used as the additive gas contributed to the effect of suppressing side etching. In particular, Comparative Example 4 containing 2% by volume of COS was insufficient in the effect of suppressing side etching as compared with Example 2 containing 2% by volume of trimethylsilane and Example 7 containing 2% by volume of Tetramethylsilane, from which it is apparent that alkylsilane has an enough sidewall protection effect as compared with COS even in a small amount.

In Comparative Example 5, $CF_3SO_2F$ was employed as the additive. Since a fluorine element is included in a molecule, etching for SiON was developed and therefore an adequate selectivity could not be achieved.

Figure 1B:
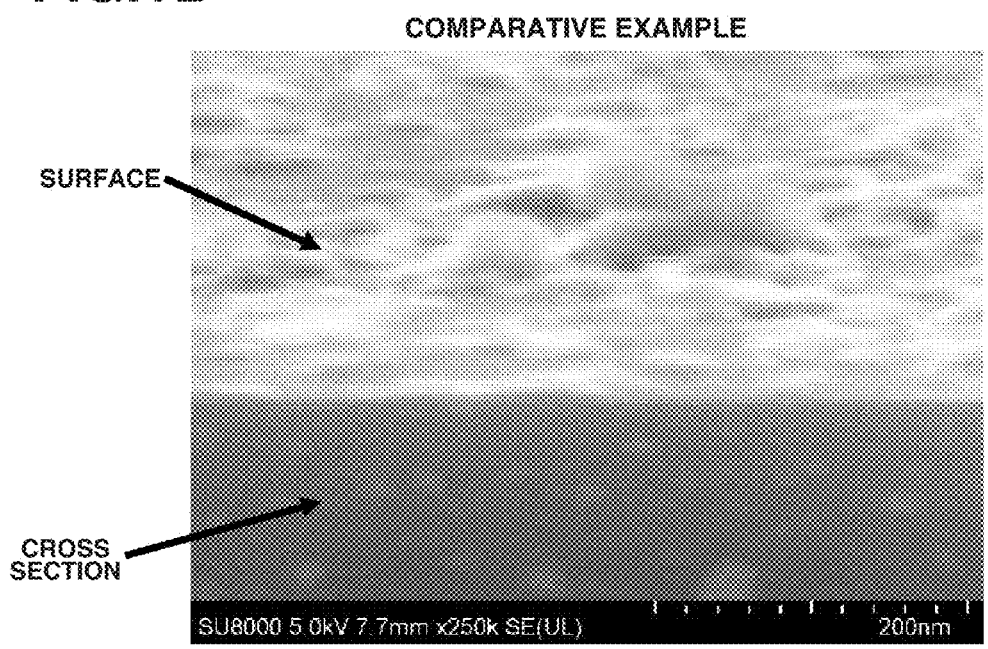
FIG. 1B is an SEM image of a cross-sectional structure of a vertically disposed silicon wafer C of Comparative Example 3 after etching.
Figure 2A:
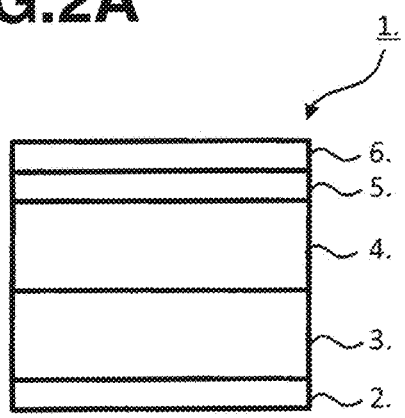
FIGS. 2A to 2F are schematic views for explaining a multilayer resist process.
Figure 2B:
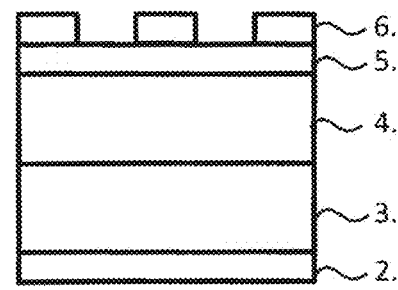
Figure 2C:
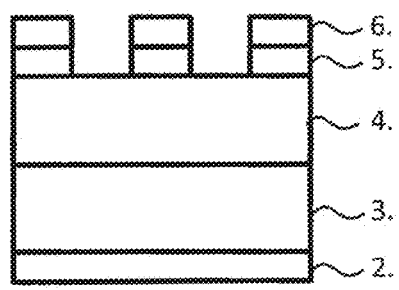
Figure 2D:
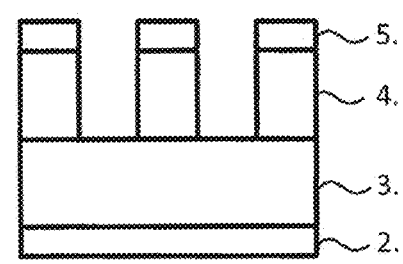
Figure 2E:
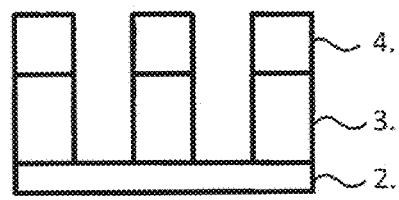
Figure 2F:
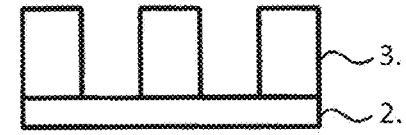
Figure 3:
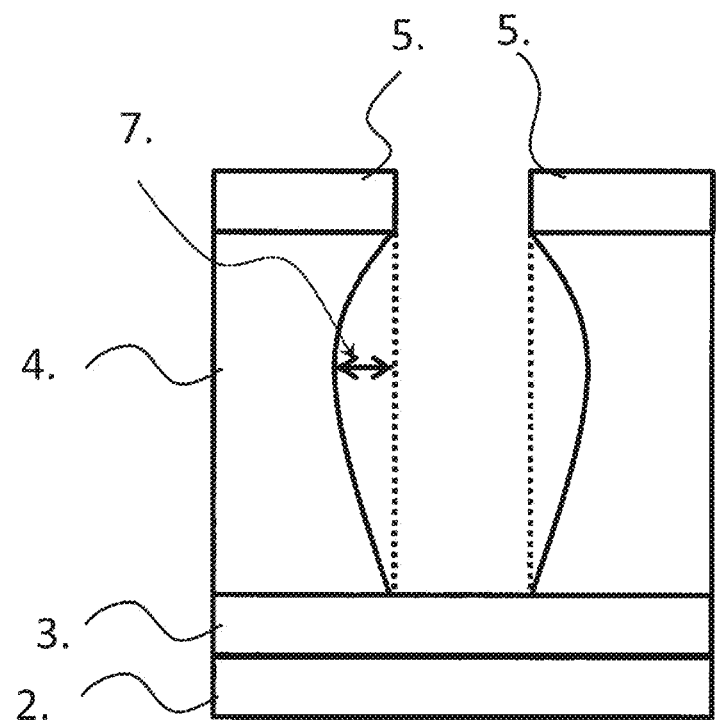
FIG. 3 is a schematic view of a multilayer resist film, explaining an undesirable isotropic etching which may occur at the time of etching an amorphous carbon layer constituting a lower layer portion of the multilayer resist film.

Moreover, FIGS. 1A and 1B are scanning electron microscope images regarding Example 2 and Comparative Example 3, respectively, observing the cross-sectional structure of the amorphous carbon layer of the vertically disposed silicon wafer C after etching from an oblique direction. An upper part of the image shows the surface of the silicon wafer C while a lower part shows the cross section of the silicon wafer C. While the surface of the amorphous carbon layer of Example 2 to which alkylsilane was added was relatively smooth as shown in FIG. 1A, that of Comparative Example 3 to which a COS gas was added was confirmed to have a lot of scale-like deposits as shown in FIG. 1B. These deposits are thought to be a residue or reaction product derived from the COS gas, and therefore viewed as a problem also in Patent Document 2. Hence it is assumed that the addition of alkylsilane makes the surface of the amorphous carbon layer smooth after etching and provides a good etching shape at the time of conducting etching on the foundation layer with use of amorphous carbon as a mask, as compared with the addition of COS.

INDUSTRIAL APPLICABILITY

The present invention is effective at forming circuit patterns on a three-dimensional integrated circuit in the semiconductor device fabrication process.

According to the present invention, it is possible to provide an etching method which can: form a sidewall protection film on the side wall of a patterned amorphous carbon layer to suppress side etching; prevent a dimensional displacement; and suppress the occurrence of abnormal etching shapes at the time of etching the amorphous carbon layer.

The entire contents of Japanese Patent Application No. 2015-184728 filed Sep. 18, 2015 are herein incorporated by reference. Although the invention has been described above by reference to certain embodiments and examples of the invention, the invention is not limited to the embodiments and examples described above. Modifications and variations of the embodiments and examples described above will occur to those skilled in the art, in light of the above teachings. The scope of the invention is defined with reference to the following claims.

What is claimed is:

1. A dry etching method comprising the steps of:
disposing a substrate within a chamber, the substrate having an amorphous carbon film;
preparing a plasma gas by converting a dry etching agent into a plasma, the dry etching agent containing at least oxygen and alkylsilane; and
conducting plasma etching on the amorphous carbon film by using the plasma gas and an inorganic film as a mask.

2. A dry etching method as claimed in claim 1, wherein the concentration of the oxygen contained in the dry etching agent is not smaller than 10 vol % of the dry etching agent, and the concentration of the alkylsilane in the dry etching agent is not smaller than 0.1 vol % and not larger than 15 vol % of the oxygen contained in the dry etching agent.

3. A dry etching method as claimed in claim 1, wherein the alkylsilane comprises at least one kind selected from the group consisting of $(CH_3)_4Si$, $(CH_3)_3SiH$, $(CH_3)_2SiH_2$ and $(CH_3)SiH_3$.

4. A dry etching method as claimed in claim 1, wherein the dry etching agent further comprises at least one kind of inert gas selected from the group consisting of $N_2$, He, Ne, Ar, Kr and Xe.

5. A dry etching method as claimed in claim 1, wherein a bias voltage is applied to the plasma gas.

6. A dry etching method as claimed in claim 2, wherein the concentration of the oxygen contained in the dry etching agent is not smaller than 80 vol % of the dry etching agent.

7. A dry etching method as claimed in claim 1, wherein the dry etching agent consists only of the oxygen and the alkylsilane, the concentration of the oxygen contained in the dry etching agent is not smaller than 10 vol % of the dry etching agent, the concentration of the alkylsilane in the dry etching agent is not smaller than 0.1 vol % and not larger than 15 vol % of the oxygen contained in the dry etching agent, and the alkylsilane comprises at least one kind selected from the group consisting of $(CH_3)_4Si$, $(CH_3)_3SiH$, $(CH_3)_2SiH_2$ and $(CH_3)SiH_3$.

8. A dry etching method as claimed in claim 7, wherein the concentration of the alkylsilane in the dry etching agent is not smaller than 0.1 vol % and not larger than 4 vol % of the oxygen contained in the dry etching agent.

* * * * *